United States Patent
Jang et al.

(10) Patent No.: US 7,915,939 B2
(45) Date of Patent: Mar. 29, 2011

(54) DUTY CYCLE CORRECTION APPARATUS AND SEMICONDUCTOR INTEGRATED CIRCUIT HAVING THE SAME

(75) Inventors: Jae Min Jang, Ichon-si (KR); Yong Ju Kim, Ichon-si (KR); Sung Woo Han, Ichon-si (KR); Hee Woong Song, Ichon-si (KR); Ic Su Oh, Ichon-si (KR); Hyung Soo Kim, Ichon-si (KR); Tae Jin Hwang, Ichon-si (KR); Hae Rang Choi, Ichon-si (KR); Ji Wang Lee, Ichon-si (KR); Chang Kun Park, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/407,727

(22) Filed: Mar. 19, 2009

(65) Prior Publication Data
US 2010/0117702 A1 May 13, 2010

(30) Foreign Application Priority Data

Nov. 12, 2008 (KR) ........................ 10-2008-0112002

(51) Int. Cl.
*H03K 5/04* (2006.01)
(52) U.S. Cl. .......................... 327/175; 327/158; 327/172
(58) Field of Classification Search ........................ None
See application file for complete search history.

(56) References Cited

U.S. PATENT DOCUMENTS

| | | | |
|---|---|---|---|
| 7,279,946 B2 * | 10/2007 | Minzoni | 327/158 |
| 7,639,552 B2 * | 12/2009 | Ku | 365/194 |
| 2007/0046347 A1 | 3/2007 | Lee | |
| 2008/0100354 A1 | 5/2008 | Lee | |
| 2008/0164920 A1 * | 7/2008 | Cho | 327/158 |
| 2009/0115475 A1 * | 5/2009 | Oh | 327/158 |
| 2009/0231006 A1 * | 9/2009 | Jang et al. | 327/175 |
| 2009/0278580 A1 * | 11/2009 | Kim | 327/158 |

FOREIGN PATENT DOCUMENTS

| | | | |
|---|---|---|---|
| KR | 1020080075286 A | 8/2008 | |
| KR | 100857447 B1 | 9/2008 | |

* cited by examiner

*Primary Examiner* — An T Luu
(74) *Attorney, Agent, or Firm* — IP & T Group LLP (57) ABSTRACT

A duty cycle correction apparatus includes a fixed delay unit configured to set a fixed delay time to a DLL clock signal and generate a delay rising clock signal; a variable delay unit configured to delay the DLL clock signal in response to a control signal and generate a delay falling clock signal; a duty cycle correction unit configured to generate a correction rising clock signal and a correction falling clock signal that are toggled in conformity with edge timing of the delay rising clock signal and the delay falling clock signal; and a delay control unit configured to detect duty cycles of the correction rising clock signal and the correction falling clock signal and generate the control signal.

18 Claims, 5 Drawing Sheets

FIG.6

DUTY CYCLE CORRECTION APPARATUS AND SEMICONDUCTOR INTEGRATED CIRCUIT HAVING THE SAME

CROSS-REFERENCES TO RELATED APPLICATION

The present application claims priority under 35 U.S.C. §119(a) to Korean application number 10-2008-0112002, filed on Nov. 12, 2008, in the Korean Intellectual Property Office, which is incorporated herein by reference in its entirety as set forth in full.

BACKGROUND

1. Technical Field

The present invention relates to a semiconductor integrated circuit, and more particularly, to a duty cycle correction apparatus provided to a semiconductor integrated circuit.

2. Related Art

A conventional semiconductor integrated circuit such as a DDR SDRAM (double data rate synchronous dynamic random access memory), processes data using both the rising edge and the falling edge of a clock signal to increase an operation speed. Therefore, if the ratio between the high level interval and the low level interval of a clock signal, that is, a duty ratio does not correspond to 50:50, operation efficiency is likely to deteriorate. However, in fact, the clock signal employed in a semiconductor integrated circuit is difficult to have a precise duty ratio due to various factors in the mounting circumstances of the semiconductor integrated circuit, such as noise, etc. Thus, in order to improve operation efficiency, the semiconductor integrated circuit includes a duty cycle correction apparatus for correcting the duty ratio of a clock signal.

A duty cycle correction apparatus is provided in a DLL (delay locked loop) circuit and is implemented in such a way as to correct the duty cycles of the pair of clock signals output from the DLL circuit. However, even when the duty cycle correction operation for the clock signals is performed at the output terminal of the DLL circuit, a phenomenon is likely to occur, in which the duty ratios of the clock signals are distorted due to delay factors in a transmission line. Also, in order to transmit the pair of clock signals, the transmission line must be implemented by a form of a pair of lines, whereby the area and power utilization efficiency of the semiconductor integrated circuit is likely to deteriorate. As a consequence, the conventional duty cycle correction apparatus has drawbacks in that it should be provided in the DLL circuit and thus the signal distortion and the deterioration of area and power utilization efficiency are likely to be caused by the transmission lines.

SUMMARY

A duty cycle correction apparatus which can supply a clock signal having improved duty ratio characteristic and a semiconductor integrated circuit having the same are described herein.

Also, a duty cycle correction apparatus which can prevent defects such as signal distortion and deterioration of area and power utilization efficiency and a semiconductor integrated circuit having the same are described herein.

According to one aspect of the present invention, a duty cycle correction apparatus comprises a fixed delay unit configured to delay a delayed locked loop (DLL) clock signal by a fixed delay time and generate a delay rising clock signal; a variable delay unit configured to delay the DLL clock signal in response to a control signal and generate a delay falling clock signal; a duty cycle correction unit configured to generate a correction rising clock signal and a correction falling clock signal that are toggled in conformity with edge timing of the delay rising clock signal and the delay falling clock signal; and a delay control unit configured to detect duty cycles of the correction rising clock signal and the correction falling clock signal and generate the control signal.

According to another aspect of the present invention, a semiconductor integrated circuit comprises a delayed locked loop (DLL) circuit configured to generate a DLL clock signal having a phase that precedes an external clock signal by a preset time, using a correction rising clock signal; a transmission line configured to transmit the DLL clock signal; a duty cycle correction apparatus configured to correct a duty cycle of the DLL clock signal transmitted through the transmission line and generate the correction rising clock signal and a correction falling clock signal; and a data output apparatus configured to perform a data output operation using the correction rising clock signal and the correction falling clock signal.

BRIEF DESCRIPTION OF THE DRAWINGS

The above objects, and other features and advantages will become more apparent after a reading of the following detailed description taken in conjunction with the drawings, in which.

DETAILED DESCRIPTION

Hereafter, exemplary embodiments will be described with reference to the accompanying drawings.

Figure 1:
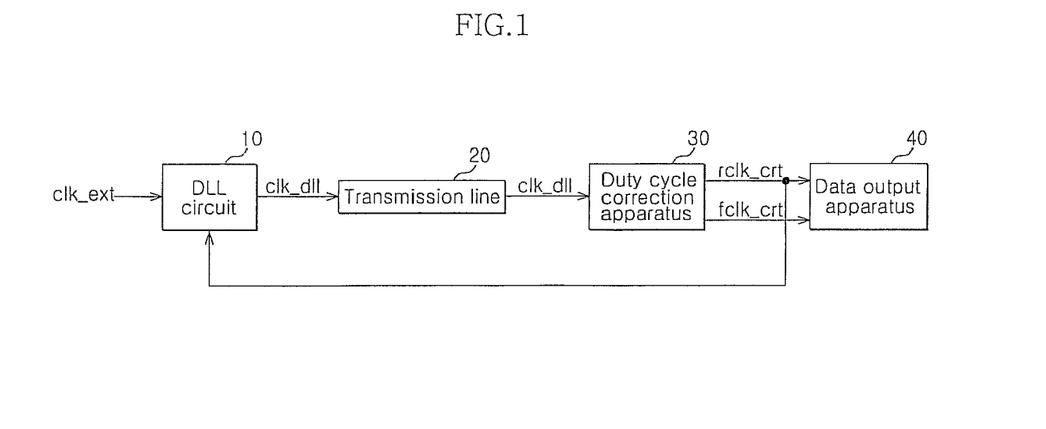
FIG. 1 is a schematic block diagram of an exemplary semiconductor integrated circuit according to one embodiment.

FIG. 1 is a schematic block diagram illustrating the configuration of an exemplary semiconductor integrated circuit according to one embodiment.

Referring to FIG. 1, a semiconductor integrated circuit according to one embodiment can include a DLL circuit 10, a transmission line 20, a duty cycle correction apparatus 30, and a data output apparatus 40.

The DLL circuit 10 can be configured to generate a DLL clock signal 'clk_dll' having a phase that precedes an external clock signal 'clk_ext' by a preset time, using a correction rising clock signal 'rclk_crt'. The transmission line 20 can be configured to transmit the DLL clock signal 'clk_dll'. The duty cycle correction apparatus 30 can be configured to correct the duty cycle of the DLL clock signal 'clk_dll' transmitted through the transmission line 20 and generate the correction rising clock signal 'rclk_crt' and a correction falling clock signal 'fclk_crt'. The data output apparatus 40 can be configured to perform a data output operation using the correction rising clock signal 'rclk_crt' and the correction falling clock signal 'fclk_crt'.

Here, the DLL circuit 10 can utilize the correction rising clock signal 'rclk_crt' as an input to the replica delay circuit provided therein. According to this, the DLL circuit 10 can precisely monitor a delay time caused due to the delay factors present in the transmission line 20. Thereafter, the DLL circuit 10 can output the DLL clock signal 'clk_dll' as a single clock signal having a single phase instead of a pair of clock signals.

The duty cycle correction apparatus 30 can generate clock signals by fixedly delaying and variably delaying the DLL clock signal 'clk_dll' transmitted through the transmission line 20 and then, can generate the correction rising clock signal 'rclk_crt' and the correction falling clock signal 'fclk_crt' by performing a duty cycle correction operation using the clock signals. Accordingly, even when the duty cycle of the DLL clock signal 'clk_dll' is distorted due to the delay factors present in the transmission line 20, since the distortion can be corrected afterwards by the duty cycle correction apparatus 30, a pair of clock signals having improved duty ratio characteristics can be supplied to the data output apparatus 40.

Further, since the transmission line 20 transmits a single clock signal instead of a pair of clock signals, the area occupied by the transmission line 20 can be decreased when compared to the conventional art. Therefore, the semiconductor integrated circuit according to the embodiment can provide advantages in that area efficiency is improved. Also, since the amount of current consumed by the transmission line 20 can be reduced when compared to the conventional art, advantages can also be provided in that power efficiency is improved.

Figure 2:
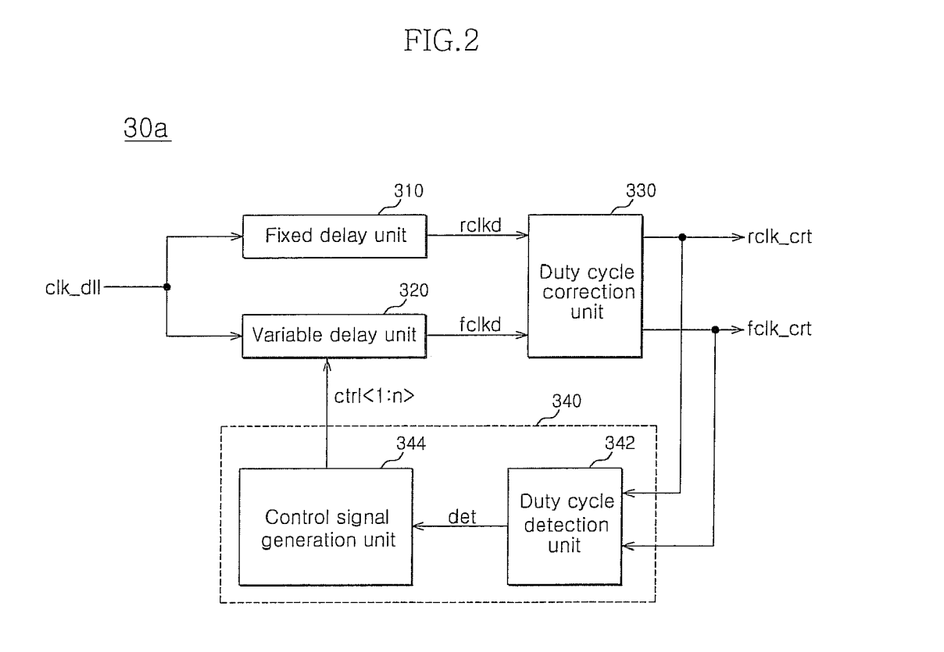
FIG. 2 is a schematic block diagram of the first example of a duty cycle correction apparatus, capable of being implemented in the circuit of FIG. 1.

FIG. 2 is a schematic block diagram illustrating the first example of the duty cycle correction apparatus capable of being implemented in the circuit of FIG. 1.

Referring to FIG. 2, a duty cycle correction apparatus 30a can include a fixed delay unit 310, a variable delay unit 320, a duty cycle correction unit 330, and a delay control unit 340.

The fixed delay unit 310 can be configured to set a fixed delay time to the DLL clock signal 'clk_dll' and generate a delay rising clock signal 'rclkd'. The variable delay unit 320 can be configured to delay the DLL clock signal 'clk_dll' in response to n-bit of a control signal 'ctrl<1:n>' and generate a delay falling clock signal 'fclkd'. The duty cycle correction unit 330 can be configured to generate the correction rising clock signal 'rclk_crt' and the correction falling clock signal 'fclk_crt' that are toggled in conformity with the edge timing of the delay rising clock signal 'rclkd' and the delay falling clock signal 'fclkd'. The delay control unit 340 can be configured to detect the duty cycles of the correction rising clock signal 'rclk_crt' and the correction falling clock signal 'fclk_crt' and generate the n-bit of the control signal 'ctrl<1: n>'.

The delay control unit 340 can include a duty cycle detection unit 342 and a control signal generation unit 344.

The duty cycle detection unit 342 can be configured to detect the duty cycles of the correction rising clock signal 'rclk_crt' and the correction falling clock signal 'fclk_crt' and generate a detection signal 'det'. The control signal generation unit 344 can be configured to generate the n-bit of the control signal 'ctrl<1:n>' in response to the detection signal 'det'.

The fixed delay unit 310 can set the fixed delay time to the DLL clock signal 'clk_dll' using delay elements having fixed delay values and generate the delay rising clock signal 'rclkd'. On the other hand, the variable delay unit 320 can variably delay the DLL clock signal 'clk_dll' depending upon the logic values of the n-bit of the control signal 'ctrl<1:n>' and generate the delay falling clock signal 'fclkd'. Preferably, the delay rising clock signal 'rclkd' and the delay falling clock signal 'fclkd' generated in these manners have a phase difference corresponding to one half cycle.

The reason why the fixed delay unit 310 and the variable delay unit 320 are provided resides in that, because the correction rising clock signal 'rclk_crt' output from the duty cycle correction unit 330 is fed back to the DLL circuit 10, by fixing the phase of the correction rising clock signal 'rclk_crt', the duty cycle correction apparatus 30a can perform the duty cycle correction operation while not influencing the operation of the DLL circuit 10. If the delay rising clock signal 'rclkd' is generated by a variable delay operation, the phase change in the correction rising clock signal 'rclk_crt' will influence the operation of the DLL circuit 10.

The duty cycle correction unit 330 can generate two clock signals that are toggled to opposite phases at every rising edge of the delay rising clock signal 'rclkd' and the delay falling clock signal 'fclkd' and output the two clocks signals as the correction rising clock signal 'rclk_crt' and the correction falling clock signal 'fclk_crt', respectively. As the duty cycle correction apparatus 30a performs the duty cycle correction operation for the DLL clock signal 'clk_dll', the delay rising clock signal 'rclkd' and the delay falling clock signal 'fclkd' have a phase difference that gradually approaches one half cycle, and the correction rising clock signal 'rclk_crt' and the correction falling clock signal 'fclk_crt' gradually have opposite phases.

The duty cycle detection unit 342 can be easily realized by the configuration of a general duty accumulator. Hence, the duty cycle detection unit 342 can detect the lengths of the high intervals and the low intervals of the correction rising clock signal 'rclk_crt' and the correction falling clock signal 'fclk_crt' and output the detected information as the detection signal 'det'.

The control signal generation unit 344 can be realized in a manner such that it can change a logic value of the control signal 'ctrl<1:n>', composed of n-bit digital signals, in response to the detection signal 'det'. At this time, it is preferred that the n-bit of the control signal 'ctrl<1:n>' is configured such that the number of bits having a logic value of '1' increases or decreases depending upon the level of the detection signal 'det'. The configurations of the duty cycle detection unit 342 and the control signal generation unit 344, that is, the configuration of the delay control unit 340 is well known to those having ordinary knowledge in the art, and therefore, detailed description thereof will be omitted herein.

As a consequence, the duty cycle correction apparatus 30a receives the DLL clock signal 'clk_dll' as a single signal instead of a pair of clock signals and then generates the pair of clock signals by performing a phase inverting operation for the input DLL clock signal 'clk_dll'. Then, the duty cycle correction apparatus 30a detects the duty cycles of the output clock signals, that is, the correction rising clock signal 'rclk_crt' and the correction falling clock signal 'fclk_crt', using the feedback loop defined therein, and according to this, generates the delay rising clock signal 'rclkd' and the delay falling clock signal 'fclkd' that have a phase difference corresponding to one half cycle. Thereupon, since the correction rising clock signal 'rclk_crt' and the correction falling clock signal 'fclk_crt' are realized in a manner such that they are toggled at every rising edge time of the delay rising clock signal 'rclkd' and the delay falling clock signal 'fclkd', the duty ratios of 50:50 of the correction rising clock signal 'rclk_crt' and the correction falling clock signal 'fclk_crt' can be obtained.

Figure 3:
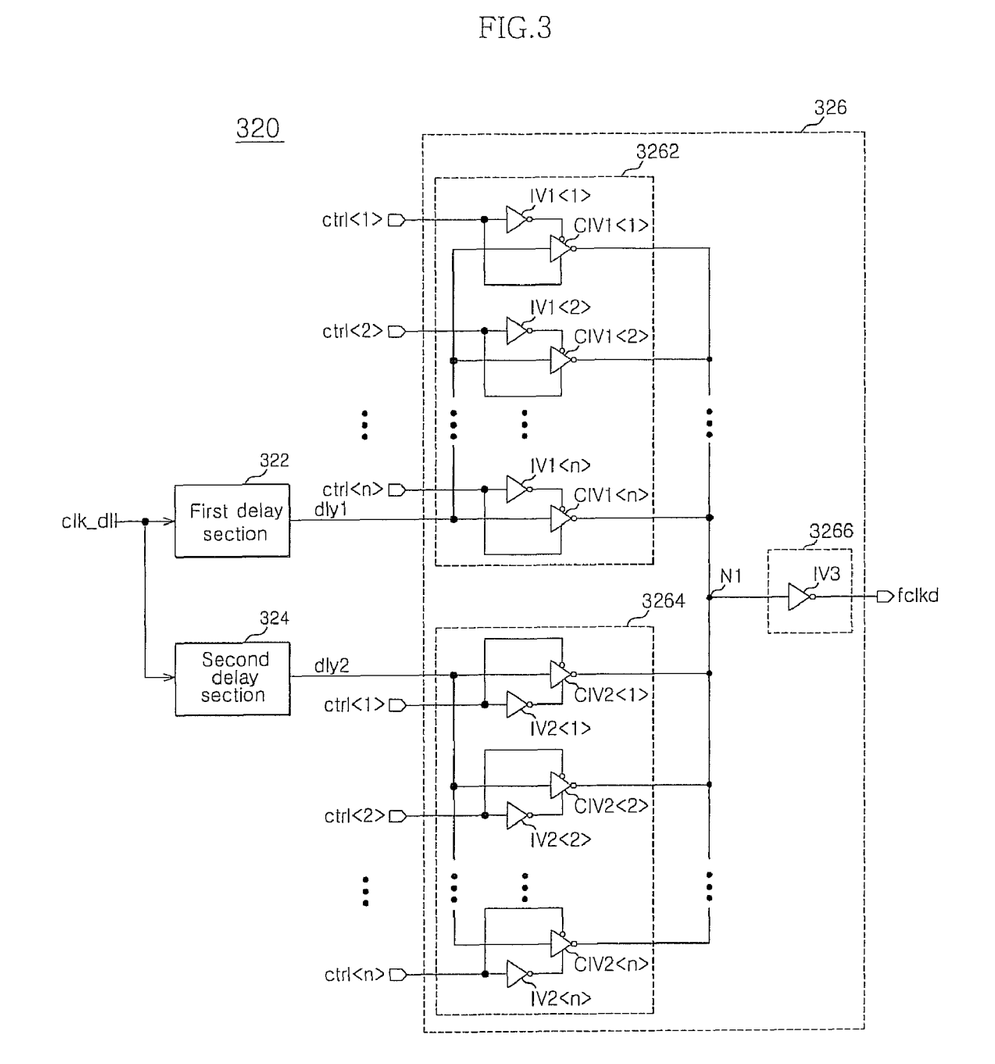
FIG. 3 is a circuit diagram of a variable delay unit capable of being implemented in the duty cycle correction apparatus of FIG. 2.

FIG. 3 is a circuit diagram of a variable delay unit capable of being implemented in the duty cycle correction apparatus of FIG. 2.

Referring to FIG. 3, the variable delay unit 320 can include a first delay section 322, a second delay section 324, and a phase mixing section 326.

The first delay section 322 can be configured to delay the DLL clock signal 'clk_dll' by a first time and generate a first delay signal 'dly1'. The second delay section 324 can be configured to delay the DLL clock signal 'clk_dll' by a second time and generate a second delay signal 'dly2'. The phase mixing section 326 can be configured to mix the phases of the first delay signal 'dly1' and the second delay signal 'dly2' in response to the n-bit of the control signal 'ctrl<1:n>' and generate the delay falling clock signal 'fclkd'.

Here, a first time as the delay time set by the first delay section 322 and a second time as the delay time set by the second delay section 324 are different from each other. Here, it is assumed that the second time is greater than the first time. The configurations of the first delay section 322 and the second delay section 324 can be easily realized as a combination of a plurality of delay elements.

The phase mixing section 326 can include a first node N1, a first driving section 3262, a second driving section 3264, and a buffering section 3266.

The first driving section 3262 can be configured to drive the first delay signal 'dly1' in response to the n-bit of the control signal 'ctrl<1:n>' and transmit the driven signal to the first node N1. The second driving section 3264 can be configured to drive the second delay signal 'dly2' in response to the n-bit of the control signal 'ctrl<1:n>' and transmit the driven signal to the first node N1. The buffering section 3266 can be configured to buffer a voltage applied to the first node N1 and output the delay falling clock signal 'fclkd'.

The first driving section 3262 can include n-numbered first inverters IV1<1:n> and n-numbered first control inverters CIV1<1:n>.

Each of the n-numbered first inverters IV1<1:n> can receive each bit of the n-bit of the control signal 'ctrl<1:n>'. Each of the n-numbered first control inverters CIV1<1:n> can drive the first delay signal 'dly1' in response to an output signal of corresponding inverter among the n-numbered first inverters IV1<1:n> and each bit of the n-bit of the control signal 'ctrl<1:n>' and output the driven signal to the first node N1.

The second driving section 3264 can include n-numbered second inverters IV2<1:n> and n-numbered second control inverters CIV2<1:n>.

Each of the n-numbered second inverters IV2<1:n> can receive each bit of the n-bit of the control signal 'ctrl<1:n>'. Each of the n-numbered second control inverters CIV2<1:n> can drive the second delay signal 'dly2' in response to an output signal of corresponding inverter among the n-numbered second inverters IV2<1:n> and each bit of the n-bit of the control signal 'ctrl<1:n>' and output the driven signal to the first node N1.

The buffering section 3266 can include a third inverter IV3.

The number of control inverters to be activated in the first driving section 3262 and the number of control inverters to be activated in the second driving section 3264 are determined depending upon the voltage levels of the respective n-bit of the control signal 'ctrl<1:n>'. If the first driving section 3262 has driving ability greater than the second driving section 3264 under the control of the n-bit of the control signal 'ctrl<1:n>', the delay falling clock signal 'fclkd' has a phase that is closer to the first delay signal 'dly1' than the second delay signal 'dly2'. In this way, the phase mixing section 326 can adjust the numbers of control inverters to be activated in the first driving section 3262 and the second driving section 3264, in response to the n-bit of the control signal 'ctrl<1:n>', whereby the output timing of the delay falling clock signal 'fclkd' can be precisely controlled.

While it was exemplified that two delay sections, that is, the first delay section 3262 and the second delay section 3264 are provided, the embodiment is not limited thereto, and it is to be understood that an increased number of delay sections can be provided.

Figure 4:
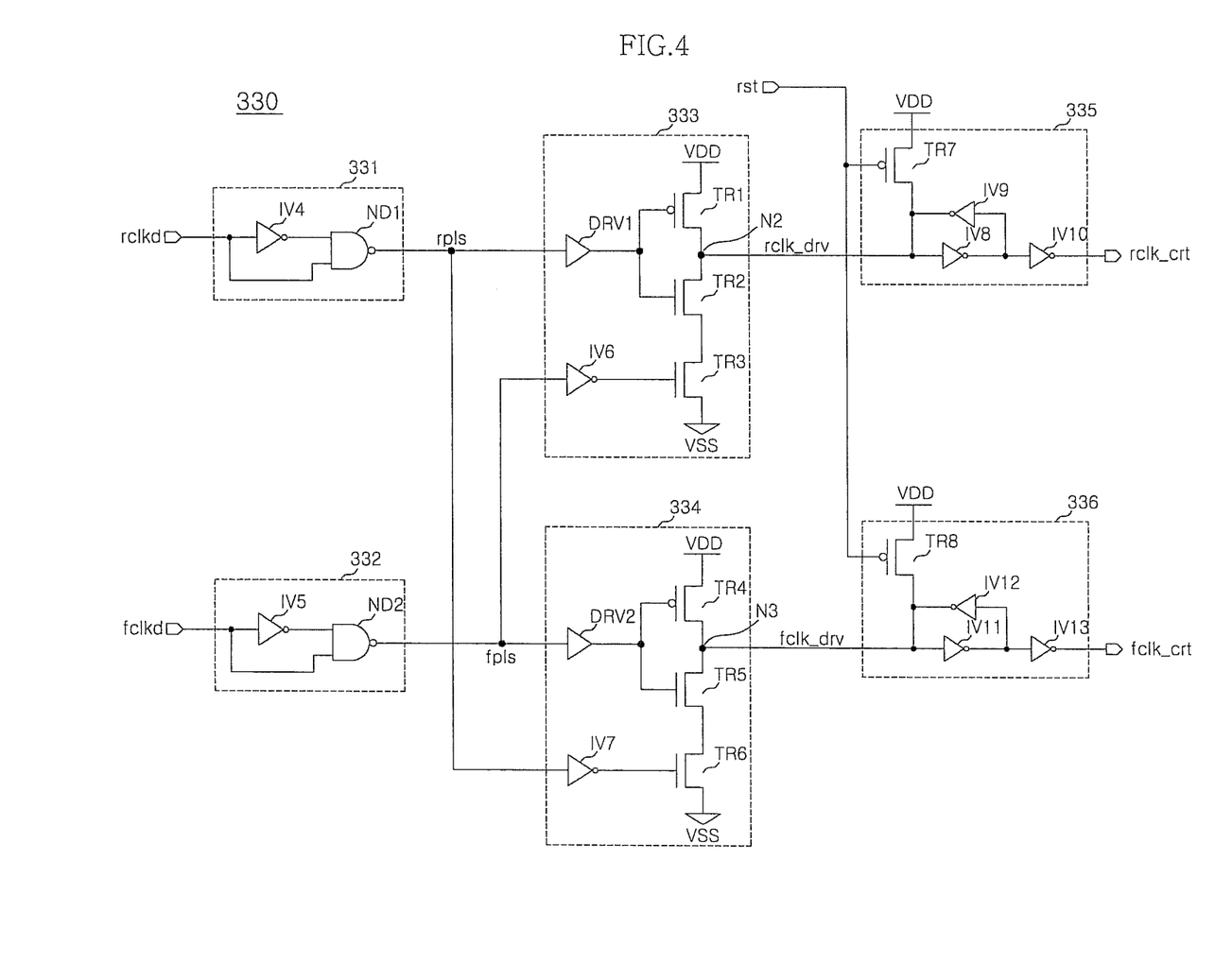
FIG. 4 is a circuit diagram of a duty cycle correction unit capable of being implemented in the duty cycle correction apparatus of FIG. 2.

FIG. 4 is a circuit diagram of the duty cycle correction unit capable of being implemented in the duty cycle correction apparatus of FIG. 2.

Referring to FIG. 4, the duty cycle correction unit 330 can include a second node N2, a third node N3, a rising pulse generation section 331, a falling pulse generation section 332, a rising clock generation section 333, a falling clock generation section 334, a rising latch section 335, and a falling latch section 336.

The rising pulse generation section 331 can be configured to generate a rising pulse signal 'rpls' that is toggled in the form of a pulse at every rising edge of the delay rising clock signal 'rclkd'. The falling pulse generation section 332 can be configured to generate a falling pulse signal 'fpls' that is toggled in the form of a pulse at every rising edge of the delay falling clock signal 'fclkd'. The rising clock generation section 333 can be configured to generate a rising driving clock signal 'rclk_drv' that is toggled in response to the rising pulse signal 'rpls' and the falling pulse signal 'fpls' and output the rising driving clock signal 'rclk_drv' to the second node N2. The falling clock generation section 334 can be configured to generate a falling driving clock signal 'fclk_drv' that is toggled in response to the rising pulse signal 'rpls' and the falling pulse signal 'fpls' and output the falling driving clock signal 'fclk_drv' to the third node N3. The rising latch section 335 can be configured to latch and drive the rising driving clock signal 'rclk_drv' in response to a reset signal 'rst' and generate the correction rising clock signal 'rclk_crt'. The falling latch section 336 can be configured to latch and drive the falling driving clock signal 'fclk_drv' in response to the reset signal 'rst' and generate the correction falling clock signal 'fclk_crt'.

The rising pulse generation section 331 can include a fourth inverter IV4 and a first NAND gate ND1.

The fourth inverter IV4 can receive the delay rising clock signal 'rclkd'. The first NAND gate ND1 can receive the delay rising clock signal 'rclkd' and the output signal of the fourth inverter IV4 and output the rising pulse signal 'rpls'.

The falling pulse generation section 332 can include a fifth inverter IV5 and a second NAND gate ND2.

The fifth inverter IV5 can receive the delay falling clock signal 'fclkd'. The second NAND gate ND2 can receive the delay falling clock signal 'fclkd' and the output signal of the fifth inverter IV5 and output the falling pulse signal 'fpls'.

The rising clock driving section 333 can include a first driver DRV1, a sixth inverter IV6, and first through third transistors TR1 through TR3.

The first driver DRV1 can drive the rising pulse signal 'rpls'. The sixth inverter IV6 can receive the falling pulse signal 'fpls'. The first transistor TR1 can have a gate receiving an output signal of the first driver DRV1, a source applied with an external power source voltage 'VDD', and a drain coupled with the second node N2. The second transistor TR2 can have a gate receiving the output signal of the first driver DRV1, and a drain coupled with the second node N2. The third transistor TR3 can have a gate receiving an output signal of the sixth inverter IV6, a drain coupled with the source of the second transistor TR2, and a source grounded.

The falling clock driving section 334 can include a second driver DRV2, a seventh inverter IV7, and fourth through sixth transistors TR4 through TR6.

The second driver DRV2 can drive the falling pulse signal 'fpls'. The seventh inverter IV7 can receive the rising pulse signal 'rpls'. The fourth transistor TR4 can have a gate receiving an output signal of the second driver DRV2, a source applied with the external power source voltage 'VDD', and a drain coupled with the third node N3. The fifth transistor TR5 can have a gate receiving the output signal of the second driver DRV2, and a drain coupled with the third node N3. The sixth transistor TR6 can have a gate receiving an output signal of the seventh inverter IV7, a drain coupled with the source of the fifth transistor TR5, and a source grounded.

The rising latch section 335 can include a seventh transistor TR7, and eighth through tenth inverters IV8 through IV10.

The seventh transistor TR7 can have a gate receiving the reset signal 'rst', a source applied with the external power source voltage 'VDD', and a drain coupled with the second node N2. The eighth inverter IV8 can receive the rising driving clock signal 'rclk_drv'. The ninth inverter IV9 can form a latch structure with the eighth inverter IV8. The tenth inverter IV10 can receive an output signal of the eighth inverter IV8 and output the correction rising clock signal 'rclk_crt'.

The falling latch section 336 can include an eighth transistor TR8, and eleventh through thirteenth inverters IV11 through IV13.

The eighth transistor TR8 can have a gate receiving the reset signal 'rst', a source applied with the external power source voltage 'VDD', and a drain coupled with the third node N3. The eleventh inverter IV11 can receive the falling driving clock signal 'fclk_drv'. The twelfth inverter IV12 can form a latch structure with the eleventh inverter IV11. The thirteenth inverter IV13 can receive an output signal of the eleventh inverter IV11 and output the correction falling clock signal 'fclk_crt'.

In the duty cycle correction section 330 configured as mentioned above, the rising pulse signal 'rpls' can be realized in a manner such that it is toggled to a low level at every rising edge of the delay rising clock signal 'rclkd' and the falling pulse signal 'fpls' can be realized in a manner such that it is toggled to a low level at every rising edge of the delay falling clock signal 'fclkd'. Since the delay rising clock signal 'rclkd' and the delay falling clock signal 'fclkd' are controlled to have a phase difference corresponding one half cycle each other, the rising pulse signal 'rpls' and the falling pulse signal 'fpls' are also controlled to have a phase difference corresponding to one half cycle of the delay rising clock signal 'rclkd' or the delay falling clock signal 'fclkd' with respect to each other.

Thereafter, the rising driving clock signal 'rclk_drv' can be realized in a manner such that it transits to a low level when the falling pulse signal 'fpls' is toggled and to a high level when the rising pulse signal 'rpls' is toggled. Similarly, the falling driving clock signal 'fclk_drv' can be realized such that it transits to a low level when the rising pulse signal 'rpls' is toggled and to a high level when the falling pulse signal 'fpls' is toggled.

The reset signal 'rst' can be realized as a low enable signal. If the reset signal 'rst' is enabled and then disabled, the rising latch section 335 latches and drives the rising driving clock signal 'rclk_drv' and generates the correction rising clock signal 'rclk_crt', and the falling latch section 336 latches and drives the falling driving clock signal 'fclk_drv' and generates the correction falling clock signal 'fclk_crt'. As these operations are repeatedly performed, the correction rising clock signal 'rclk_crt' and the correction falling clock signal 'fclk_crt' can be gradually realized as clock signals having a duty ratio of 50:50.

Figure 5:
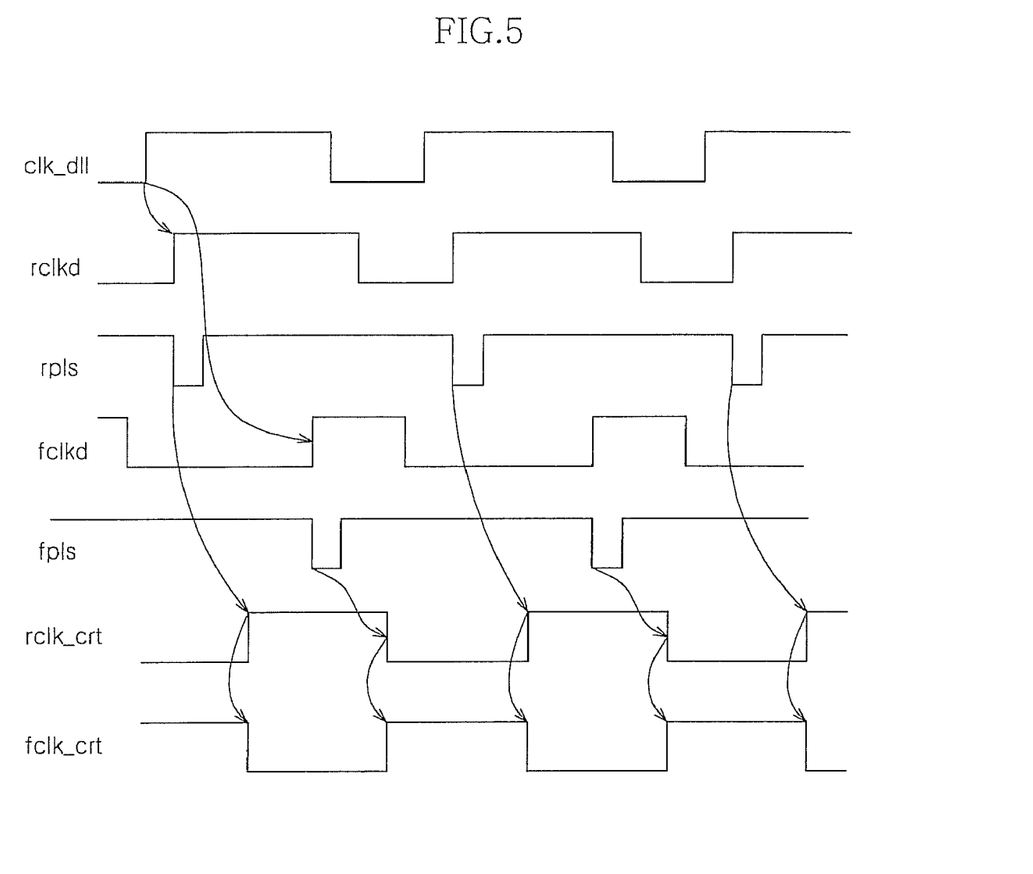
FIG. 5 is a timing diagram explaining operations of the duty cycle correction apparatus shown in FIG. 2.

FIG. 5 is a timing diagram explaining operations of the duty cycle correction apparatus shown in FIG. 2.

It is exemplified in the drawing that the low interval of the DLL clock signal 'clk_dll' is narrower than the high interval of the DLL clock signal 'clk_dll'. The delay rising clock signal 'rclkd' and the delay falling clock signal 'fclkd' are generated by delaying the DLL clock signal 'clk_dll' (that is, the delay rising clock signal 'rclkd' is generated through fixed delaying, and the delay falling clock signal 'fclkd' is generated through variable delaying). The rising edge of the delay rising clock signal 'rclkd' and the rising edge of the delay falling clock signal 'fclkd' have a phase difference corresponding to one half cycle of the DLL clock signal 'clk_dll' under the control of the n-bit of the control signal 'ctrl<1:n>'.

The rising pulse signal 'rpls' and the falling pulse signal 'fpls' are realized in a manner such that they are toggled at every rising edge time of the delay rising clock signal 'rclkd' and the delay falling clock signal 'fclkd', respectively. Thereafter, the correction rising clock signal 'rclk_crt' and the correction falling clock signal 'fclk_crt' are realized in a manner such that they are toggled while having opposite phases by toggling of the rising pulse signal 'rpls' and toggling of the falling pulse signal 'fpls', respectively.

Figure 6:
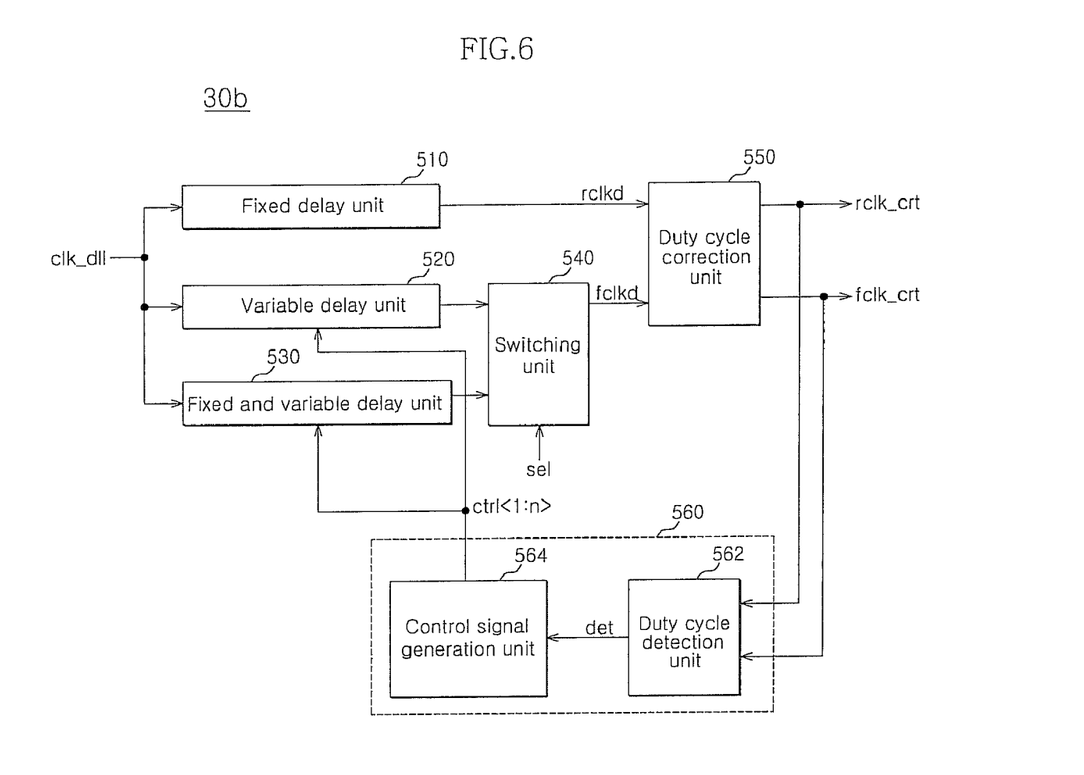
FIG. 6 is a schematic block diagram of the second example of a duty cycle correction apparatus, capable of being implemented in the circuit of FIG. 1.

FIG. 6 is a schematic block diagram of the second example of the duty cycle correction apparatus capable of being implemented in the circuit of FIG. 1.

A duty cycle correction apparatus 30b according to this embodiment is configured in a similar manner to the aforementioned embodiment in that it includes a fixed delay unit 510, a variable delay unit 520, a duty cycle correction unit 550, and a delay control unit 560. In this embodiment, the delay control unit 560 includes a duty cycle detection unit 562 and a control signal generation unit 564. In this embodiment, a fixed and variable delay unit 530 and a switching unit 540 are additionally provided. A delay falling clock signal 'fclkd' is realized by selecting any one of an output clock signal of the variable delay unit 520 and an output clock signal of the fixed and variable delay unit 530. A select signal 'sel' for controlling the operation of the switching unit 540 can be realized in a manner such that it is preset by using a fuse option, an MRS (mode register set) circuit, etc.

Even when the delay amount of the variable delay unit 520 is maximized or minimized, the output clock signal of the variable delay unit 520 may not have a phase difference corresponding to one half cycle with respect to the delay rising clock signal 'rclkd'. The fixed and variable delay unit 530 is provided to cope with this problem and has a configuration in which a fixed delay and a variable delay are connected in series. That is to say, depending upon the amount of the fixed delay defined in the fixed and variable delay unit 530, the phase range of an output clock signal of the fixed and variable delay unit 530 can be determined.

As is apparent from the above description, in the duty cycle correction apparatus according to the embodiments, a duty cycle correction operation is performed using clocks that are generated by receiving not a pair of clock signals but a single clock signal and fixedly and variably delaying the single clock signal. Accordingly, since the duty cycle correction apparatus need not be provided in a DLL circuit, it may be provided in a region where a clock signal is used, such as a data output apparatus, and so forth. Therefore, it is possible to supply a clock signal having improved duty characteristic to the data output apparatus, and so forth. Also, in the semiconductor integrated circuit according to the embodiment, a DLL circuit can perform a delay locking operation by being fed back with the clock signal output from the duty cycle correction apparatus. Accordingly, it is possible to generate a DLL clock signal through precise delay modeling. Further, since the area occupied by a transmission line for transmitting the DLL clock signal output from the DLL circuit is decreased, the high integration of the semiconductor integrated circuit can be easily accomplished. Also, because the current consumed by the transmission line is reduced, a technical basis for realizing low power consumption can be rendered.

As a consequence, in the duty cycle correction apparatus and the semiconductor integrated circuit having the same according to the embodiments, defects due to the signal distortion by the presence of transmission lines can be eliminated, and it is possible to supply a clock signal having improved duty ratio characteristics to the data output apparatus.

Moreover, in the duty cycle correction apparatus and the semiconductor integrated circuit having the same according to the embodiments, due to the fact that the number of clock signal transmission lines is decreased, defects such as deterioration of area and power utilization efficiency can be eliminated.

Although exemplary embodiments have been described for illustrative purposes, those skilled in the art will appreciate that various modifications, additions and substitutions are possible, without departing from the scope and the spirit as disclosed in the accompanying claims.

What is claimed is:

1. A duty cycle correction apparatus comprising:
   a fixed delay unit configured to set a fixed delay time to a DLL clock signal and generate a delay rising clock signal;
   a variable delay unit configured to delay the DLL clock signal in response to a control signal and generate a delay falling clock signal;
   a duty cycle correction unit configured to generate a correction rising clock signal and a correction falling clock signal that are toggled in conformity with edge timing of the delay rising clock signal and the delay falling clock signal; and
   a delay control unit configured to detect duty cycles of the correction rising clock signal and the correction falling clock signal and generate the control signal.

2. The duty cycle correction apparatus according to claim 1, wherein the DLL clock signal is inputted as a single clock signal rather than a pair of clock signals.

3. The duty cycle correction apparatus according to claim 1,
   wherein the control signals is realized as a combination of plural-bit digital signals, and
   wherein the variable delay unit is configured to variably delay the DLL clock signal depending upon a logic level of the control signal in a manner such that the delay falling clock signal and the delay rising clock signal have a phase difference corresponding to one half cycle.

4. The duty cycle correction apparatus according to claim 3, wherein the variable delay unit comprises:
   a first delay section configured to delay the DLL clock signal by a first time and generate a first delay signal;
   a second delay section configured to delay the DLL clock signal by a second time less than the first time and generate a second delay signal; and
   a phase mixing section configured to mix phases of the first delay signal and the second delay signal in response to the control signal and generate the delay falling clock signal.

5. The duty cycle correction apparatus according to claim 4, wherein the phase mixing section comprises:
   a first node;
   a first driving section configured to drive the first delay signal in response to the control signal and transmit the driven signal to the first node;
   a second driving section configured to drive the second delay signal in response to the control signal and transmit the driven signal to the first node; and
   a buffering section configured to buffer the voltage applied to the first node and output the delay falling clock signal.

6. The duty cycle correction apparatus according to claim 1, wherein the duty cycle correction unit is configured to generate the correction rising clock signal and the correction falling clock signal that are toggled to opposite phases at every rising edge of the delay rising clock signal and the delay falling clock signal.

7. The duty cycle correction apparatus according to claim 6, wherein the duty cycle correction unit comprises:
   a rising pulse generation section configured to generate a rising pulse signal that is toggled in the form of a pulse at every rising edge of the delay rising clock signal;
   a falling pulse generation section configured to generate a falling pulse signal that is toggled in the form of a pulse at every rising edge of the delay falling clock signal;
   a rising clock generation section configured to generate a rising driving clock signal that is toggled in response to the rising pulse signal and the falling pulse signal;
   a falling clock generation section configured to generate a falling driving clock signal that is toggled in response to the rising pulse signal and the falling pulse signal;
   a rising latch section configured to latch and drive the rising driving clock signal in response to a reset signal and generate the correction rising clock signal; and
   a falling latch section configured to latch and drive the falling driving clock signal in response to the reset signal and generate the correction falling clock signal.

8. The duty cycle correction apparatus according to claim 1, wherein the delay control unit comprises:
   a duty cycle detection unit configured to detect the duty cycles of the correction rising clock signal and the correction falling clock signal and generate a detection signal; and
   a control signal generation unit configured to generate the control signal in response to the detection signal.

9. The duty cycle correction apparatus according to claim 8, wherein the control signal generation unit is configured to output plural-bit digital signals in which the number of bits having a first logic value increases or decreases in response to the detection signal, as the control signal.

10. The duty cycle correction apparatus according to claim 1, further comprising:
    a fixed and variable delay unit configured to set a fixed delay amount to the DLL clock signal and variably delay again the clock signal fixedly delayed in response to the control signal; and
    a switching unit configured to selectively transmit an output signal of the variable delay unit and an output signal of the fixed and variable delay unit to an input terminal for the delay falling clock signal of the duty cycle correction section, in response to a select signal.

11. A semiconductor integrated circuit comprising:
a DLL circuit configured to generate a DLL clock signal having a phase that precedes an external clock signal by a preset time, using a correction rising clock signal;
a transmission line configured to transmit the DLL clock signal;
a duty cycle correction apparatus configured to correct a duty cycle of the DLL clock signal transmitted through the transmission line and generate the correction rising clock signal and a correction falling clock signal; and
a data output apparatus configured to perform a data output operation using the correction rising clock signal and the correction falling clock signal,
wherein the DLL circuit is configured to be fed back with the correction rising clock signal and utilize the correction rising clock signal as an input to a replica delay circuit provided therein.

12. The semiconductor integrated circuit according to claim 11, wherein the DLL circuit is configured to output the DLL clock signal as a single clock signal rather than a pair of clock signals.

13. The semiconductor integrated circuit according to claim 12, wherein the duty cycle correction apparatus comprises:
a fixed delay unit configured to set a fixed delay time to the DLL clock signal and generate a delay rising clock signal;
a variable delay unit configured to delay the DLL clock signal in response to a control signal and generate a delay falling clock signal;
a duty cycle correction unit configured to generate the correction rising clock signal and the correction falling clock signal that are toggled in conformity with edge timing of the delay rising clock signal and the delay falling clock signal; and
a delay control unit configured to detect duty cycles of the correction rising clock signal and the correction falling clock signal and generate the control signal.

14. The semiconductor integrated circuit according to claim 13,
wherein the control signal is realized as a combination of plural-bit digital signals, and
wherein the variable delay unit is configured to variably delay the DLL clock signal depending upon a logic level of the control signal in a manner such that the delay falling clock signal and the delay rising clock signal have a phase difference corresponding to one half cycle.

15. The semiconductor integrated circuit according to claim 14, wherein the variable delay unit comprises:
a first delay section configured to delay the DLL clock signal by a first time and generate a first delay signal;
a second delay section configured to delay the DLL clock signal by a second time less than the first time and generate a second delay signal; and
a phase mixing section configured to mix phases of the first delay signal and the second delay signal in response to the control signal and generate the delay falling clock signal.

16. The semiconductor integrated circuit according to claim 13, wherein the duty cycle correction unit is configured to generate the correction rising clock signal and the correction falling clock signal that are toggled to opposite phases at every rising edge of the delay rising clock signal and the delay falling clock signal.

17. The semiconductor integrated circuit according to claim 16, wherein the duty cycle correction unit comprises:
a rising pulse generation section configured to generate a rising pulse signal that is toggled in the form of a pulse at every rising edge of the delay rising clock signal;
a falling pulse generation section configured to generate a falling pulse signal that is toggled in the form of a pulse at every rising edge of the delay falling clock signal;
a rising clock generation section configured to generate a rising driving clock signal that is toggled in response to the rising pulse signal and the falling pulse signal;
a falling clock generation section configured to generate a falling driving clock signal that is toggled in response to the rising pulse signal and the falling pulse signal;
a rising latch section configured to latch and drive the rising driving clock signal in response to a reset signal and generate the correction rising clock signal; and
a falling latch section configured to latch and drive the falling driving clock signal in response to the reset signal and generate the correction falling clock signal.

18. The semiconductor integrated circuit according to claim 13, wherein the delay control unit is configured to detect the duty cycles of the correction rising clock signal and the correction falling clock signal, generate a detection signal, and output plural-bit digital signals in which the number of bits having a first logic value increases or decreases in response to the detection signal, as the control signal.

* * * * *